United States Patent [19]

Gay

[11] 4,424,462
[45] Jan. 3, 1984

[54] SWITCHED DELAY CIRCUIT

[75] Inventor: Michael J. Gay, Vaud, Switzerland

[73] Assignee: Motorola, Inc., Schaumburg, Ill.

[21] Appl. No.: 372,876

[22] Filed: Apr. 29, 1982

[51] Int. Cl.³ .................... H03K 5/159; H03K 6/00; H03K 17/16

[52] U.S. Cl. .................................. 307/603; 307/520; 307/543; 307/556

[58] Field of Search ............... 307/603, 520, 543, 556

[56] References Cited

U.S. PATENT DOCUMENTS

| | | | |
|---|---|---|---|
| 4,035,669 | 7/1977 | Yokoyama | 307/603 |
| 4,042,842 | 8/1977 | Hegendorfer | 307/603 |
| 4,269,496 | 5/1981 | Motoori et al. | 307/603 |
| 4,334,195 | 6/1982 | Luce | 307/556 |

Primary Examiner—John S. Heyman
Attorney, Agent, or Firm—Joe E. Barbee

[57] ABSTRACT

A delay circuit is provided having a low-pass filter and a subtracting circuit which are both integrable on a single semiconductor chip. The subtracting circuit provides an output signal proportional to the difference in magnitude of the delay circuit input signal and a differentiated output signal of the low-pass filter such that the output signal is a phase-delayed version of the input signal. The phase delay provided by the delay circuit is enabled and disabled by a control signal present at a control input to the delay circuit.

4 Claims, 3 Drawing Figures

SWITCHED DELAY CIRCUIT

This invention relates, in general, to delay circuits, and more particularly, to a delay circuit suitable for implementation in an integrated circuit and having a switchable delay.

In electronics systems it is sometimes necessary to match delays in signal paths. For example, in color TV receivers it is necessary to match the delays of the luma and chroma signals so that the luminance and chrominance transitions coincide on the TV screen. System constraints for color TV receivers make it necessary to provide additional delay in the luma signal path in order to match the luma and the chroma signal path delays. In present receivers the added delay is obtained by using a multi-section LC network.

Matching luma and chroma signal delays becomes even more difficult in TV receivers which receive more than one of the PAL, SECAM, and NTSC transmission standards. In these multistandard TV receivers, the delay required in the luma signal path will vary depending on the standard being received. The delay provided by a multi-section LC network, however, cannot be varied easily. To achieve a switchable delay, two or more multi-section LC network devices may be needed. In addition, such LC systems are prone to pick-up of parasitic high-frequency signals. This problem results from the physical size of the filter elements and the fact that the inductor magnetic fields cannot be closely confined with core materials currently available for wide-band operation. To remedy the parasitic problem, the LC networks often must be elaborately shielded.

Accordingly, it is an object of the present invention to provide an improved delay circuit which has a switchable delay and is less sensitive to pick-up of parasitic signals.

Another object of this invention is to provide a delay circuit which is suitable for use in a multistandard color TV receiver.

Still another object of this invention is to provide an improved delay circuit suitable for implementation in a single integrated circuit.

SUMMARY OF THE INVENTION

In carrying out the above and other objects of the invention, there is provided, in one form, a delay circuit having an input, an output, a low-pass filter and a subtracting circuit. The low-pass filter has an input coupled to the input of the delay circuit, a differentiated output, and a reactive element. The subtracting circuit has a first input coupled to the input of the low-pass filter, a second input coupled to the low-pass filter differentiated output, and an output coupled to the output of the delay circuit. The subtracting circuit provides an output signal proportional to the difference in magnitude of the first and second input signals of the subtracting circuit such that the delay circuit output signal is delayed in phase from the delay circuit input signal.

DETAILED DESCRIPTION OF THE DRAWINGS

It is established in the art that a lumped element circuit having an all-pass transfer characteristic provides an essentially constant delay for input signals within a limited frequency band. The performance of the all-pass delay circuit is defined in terms of the constancy of the delay and the bandwidth of operation. These performance criteria are essentially determined by the order of the polynomials of the Laplace transform transfer function of the delay circuit. Generally, the higher the order of the Laplace polynomials, the better the performance of the delay circuit. Such a high-order transfer function may be implemented by cascading multiple all-pass circuit sections having second-order transfer functions. An overall even-order all-pass transfer function is realized by such a cascaded network. To implement an overall odd-order transfer function, an additional first-order all-pass section may be added to the cascaded network.

Figure 1:
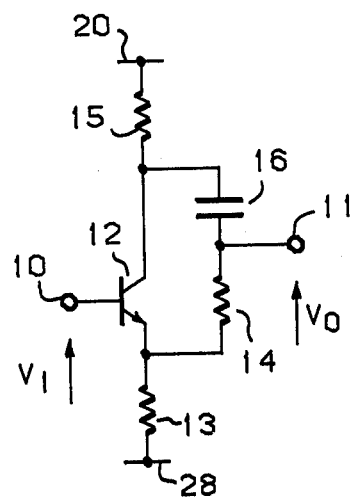
FIG. 1 is a schematic of a first-order all-pass circuit.

FIG. 1 shows a well-known active first-order all-pass circuit. In FIG. 1, input node 10 is coupled to the base of transistor 12. Resistor 15 couples the collector of transistor 12 to voltage bus 20. Resistor 13 couples the emitter of transistor 12 to voltage bus 21. Capacitor 16 couples the collector of transistor 12 to output node 11, and resistor 14 couples the emitter of transistor 12 to output node 11. If resistors 13 and 15 have equal resistance, the transfer characteristic of the circuit of FIG. 1, expressed in Laplace transform notation, is given by:

$$\frac{V_o}{V_1} = \frac{1 - sRC}{1 + sRC} \tag{1}$$

where $V_0$ is the voltage at output node 11, $V_1$ is the voltage at input node 10, C is the capacitance of capacitor 16, and R is the resistance of resistor 14.

A second-order all-pass transfer characteristic may be expressed in Laplace transform notation as:

$$G(s) = \frac{1 - \alpha s\tau + s^2\tau^2}{1 + \alpha s\tau + s^2\tau^2} \tag{2}$$

The transfer function of Equation (2) results in a pole-zero diagram having a pair of complex conjugate poles, $S_{p1}$ and $S_{p2}$, and a pair of complex conjugate zeroes, $S_{z1}$ and $S_{z2}$, given by:

$$S_{p1} = -\frac{\alpha}{2} + j\frac{1}{\tau}\sqrt{1 - \frac{\alpha^2}{4}} \tag{2a}$$

$$S_{p2} = -\frac{\alpha}{2} - j\frac{1}{\tau}\sqrt{1 - \frac{\alpha^2}{4}} \tag{2b}$$

$$S_{z1} = \frac{\alpha}{2} + j\frac{1}{\tau}\sqrt{1 - \frac{\alpha^2}{4}} \tag{2c}$$

$$S_{z2} = \frac{\alpha}{2} - j\frac{1}{\tau}\sqrt{1 - \frac{\alpha^2}{4}} \tag{2d}$$

The maximum delay provided by the transfer function of Equation (2) is approximately $4\tau/\alpha$.

The pole and zero positions defined by Equation (2) may be changed by varying $\alpha$ and $\tau$. Variations in $\alpha$ and τ, however, will not alter the symmetry about the imaginary axis of the pole-zero diagram. By cascading second-order all-pass circuits and choosing appropriate values of α and τ for each circuit, one can implement any desired even-order response. Also, one can implement an odd-order response by adding a further section having the transfer characteristic of Equation (1).

Figure 2:
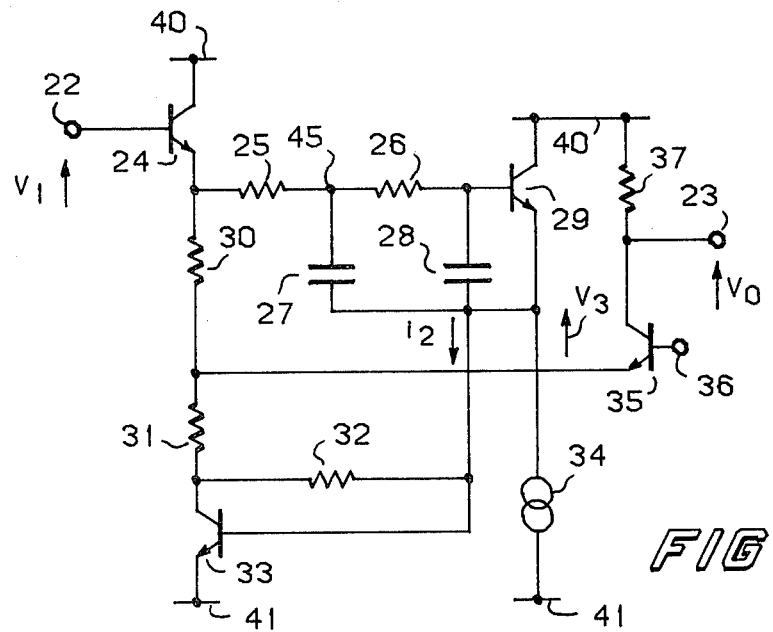
FIG. 2 is a schematic of a preferred embodiment of a second-order all-pass delay circuit.

FIG. 2 shows an all-pass circuit providing the transfer characteristic of Equation (2). In FIG. 2, input node 22 is coupled to the base of transistor 24. The collector of transistor 24 is coupled to voltage bus 40. Resistor 25 couples the emitter of transistor 24 to node 45. Resistor 26 couples node 45 to the base of transistor 29. Capacitor 27 couples node 45 to the emitter of transistor 29. The collector of transistor 29 is coupled to voltage bus 40. Capacitor 28 couples the base of transistor 29 to the base of transistor 33. Current source 34 couples the emitter of transistor 29 to voltage bus 41. Resistor 32 couples the base of transistor 33 to the collector of transistor 33. The emitter of transistor 33 is coupled to voltage bus 41. Resistor 31 couples the collector of transistor 33 to the emitter of transistor 35 and resistor 30 couples the emitter of transistor 24 to the emitter of transistor 35. Transistor 35 has a base coupled to bias voltage node 36 and a collector coupled to voltage bus 40 via resistor 37. The collector of transistor 35 is also coupled to output node 23.

The all-pass circuit of FIG. 2 consists of a low-pass filter and a subtracting circuit connected to provide the all-pass transfer function. Resistors 25 and 26, capacitors 27 and 28, transistor 29, and current source 34 form the low-pass filter. The input impedance at the base of transistor 33 is very low due to the shunt feedback provided by resistor 32. Therefore, the response of the low-pass circuit is essentially the same as if capacitor 28 were connected between the emitter of transistor 29 and voltage bus 41. The transfer function from input node 22 to the emitter of transistor 29 is given by:

$$\frac{V_3}{V_1} = \frac{1}{1 + sC_2(R_1 + R_2) + s^2 C_1 C_2 R_1 R_2} \tag{3}$$

where $V_1$ is the voltage at input node 22, $V_3$ is the low-pass output voltage at the emitter of transistor 29, $R_1$ is the resistance of resistor 25, $R_2$ is the resistance of resistor 26, $C_1$ is the capacitance of capacitor 27, and $C_2$ is the capacitance of capacitor 28.

Assuming that the signals at the emitter and base of transistor 29 are substantially equal, the current $i_2$ flowing in capacitor 28 is given by:

$$i_2 = V_3 s C_2.$$

The current $i_2$ represents a differentiated output signal of the low-pass filter. The desired all-pass response of Equation (2) is implemented by subtracting a signal proportional to $i_2$ from a signal proportional to the input of the delay circuit. This function is performed by the subtracting circuit referred to previously.

In FIG. 2, the subtracting circuit includes resistors 30, 31, 32 and 37; and transistors 33 and 35. The emitter of transistor 35 presents a very low input impedance. Therefore, the current $i_2$ applied to the feedback circuit formed by transistor 33 and resistor 32 causes current $i_3$ to flow in the emitter of transistor 35. Current $i_3$ is given by:

$$i_3 = V_3 s C_2 \frac{R_5}{R_4}.$$

Another current, $i_4$, also flows in the emitter of transistor 35 due to the voltage applied at input node 22. Summing the currents $i_3$ and $i_4$ flowing in the emitter of transistor 35 and taking phasing of the signal into account, one can show that the transfer function of the circuit of FIG. 2 is given by:

$$\frac{V_o}{V_1} = \frac{R_6}{R_3} \cdot \frac{1 + sC_2\left(R_1 + R_2 - \frac{R_3 R_5}{R_4}\right) + s^2 C_1 C_2 R_1 R_2}{1 + sC_2(R_1 + R_2) + s^2 C_1 C_2 R_1 R_2} \tag{4}$$

where $V_0$ is the voltage at output node 23, $R_3$ is the resistance of resistor 30, $R_4$ is the resistance of resistor 31, $R_5$ is the resistance of resistor 32, $R_6$ is the resistance of resistor 37, and the other variables represent the same elements as those of Equation (3).

Equation (4) may be written in the form:

$$\frac{V_o}{V_1} = \frac{R_6}{R_3} \cdot \frac{1 - \alpha s \tau + s^2 \tau^2}{1 + \alpha s \tau + s^2 \tau^2} \tag{5}$$

where the terms are given by:

$$\tau^2 = C_1 C_2 R_1 R_2$$

$$\alpha \tau = C_2 (R_1 + R_2),$$

if the condition is imposed whereby:

$$\frac{R_3 R_5}{R_4} = 2(R_1 + R_2).$$

Equation (5) is in the form of the all-pass transfer function as defined in Equation (2) having an additional gain factor. The circuit of FIG. 3, therefore, provides the desired all-pass response.

Figure 3:
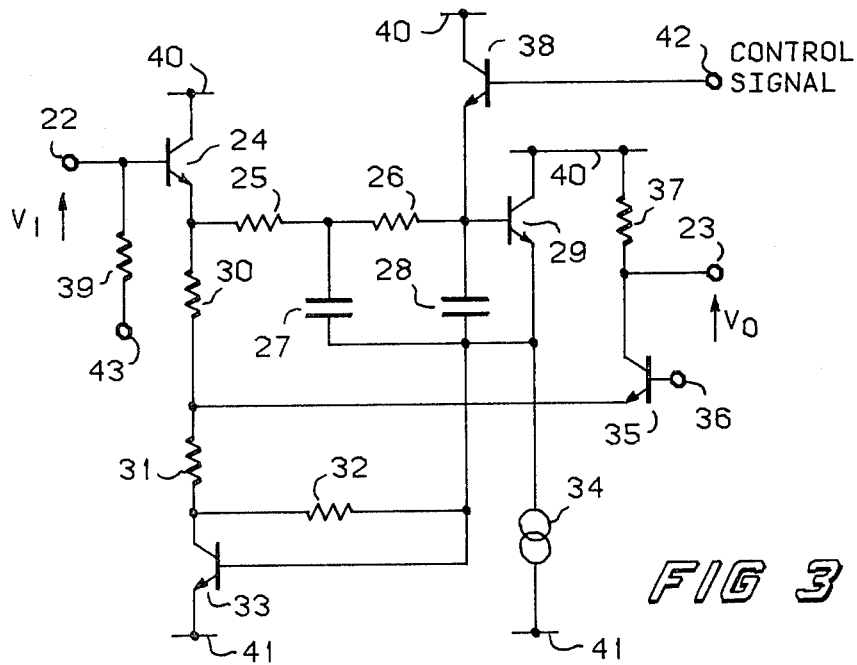
FIG. 3 is a schematic of the preferred embodiment of FIG. 2 further including control circuitry for enabling and disabling the delay circuit.

FIG. 3 shows the circuit of FIG. 2 modified to provide a control signal to enable and disable the signal delay. The elements of FIG. 3 having the same numbers as those in FIG. 2 have already been discussed in connection with FIG. 2 and will not be discussed further. Additionally, in FIG. 3, resistor 39 couples input node 22 to bias voltage node 43. Transistor 38 forms an emitter follower responsive to a control signal applied at its base. Transistor 38 has a collector coupled to voltage bus 40, a base coupled to control input 42, and an emitter coupled to the base of transistor 29. When the base of transistor 38 is held in a low-voltage state, transistor 38 is maintained in a non-conducting state. The circuit of FIG. 3 then operates as an all-pass network described previously in connection with FIG. 2. When the voltage applied at control input 42 exceeds the bias voltage at node 43 by a large enough margin, transistor 38 enters a conducting state and presents a low impedance at the base of transistor 29. No signal voltage is then developed at the base of transistor 29, and no signal current flows in capacitor 28. The only signal current then flowing in transistor 35 is current $i_4$ generated by the voltage at input node 22. The resulting output voltage at output node 23 is given by:

$$V_o = \frac{R_6}{R_3} V_1. \tag{6}$$

The output voltage given by Equation (6) is equal in amplitude to the output voltage obtained when transistor 38 is not conducting; however, the output signal has no delay with respect to the voltage at input node 22.

Several features of the circuit of FIG. 3 facilitate cascading these circuits. Providing that transistor 38 does not rob all the emitter current from transistor 24, the voltage at the emitter of transistor 24 remains essentially constant. As a result, the bias currents flowing in transistors 33 and 35 do not change significantly. The quiescent output voltage at node 23 is, therefore, not affected when the delay is switched off. Thus, the output signal level and the quiescent output voltage remain essentially the same regardless of the state of the control input signal at node 42. Since the circuit of FIG. 3 provides an all-pass response, the amplification of any incremental changes in the quiescent input voltage of any stage is the same as the signal amplification. In most cases this gain will be unity and any bias voltage offsets induced at the input of any section will not be amplified by subsequent cascaded sections. Thus, saturation of subsequent sections will not occur. Therefore, any number of circuits like that illustrated in FIG. 2 or FIG. 3 may be cascaded.

Any of the cascaded sections described above may be equipped with means for eliminating their delay, as in FIG. 3. A delay network having several values of delay is, therefore, easily realized. Additionally, the control nodes 42 of any number of these sections may be connected in parallel so that more than one of the cascaded sections may have its delay controlled by one control input signal.

Also, if component tolerances are too large for the necessary precision required in a given application, the cascaded network may be realized with additional sections. Any unnecessary sections may be trimmed during the manufacture—for example, by cutting metal links—to leave only the desired number of cascaded sections operational.

A cascaded delay circuit can be placed in the luma signal path of a multi-standard TV receiver. Such a delay circuit can be made to provide a different delay for each standard received, the delay being controlled by the control signals present on the one or more control inputs of the cascaded sections.

The active delay circuit herein disclosed may be easily implemented in integrated circuit form. Such a delay circuit will be less susceptible to parasitic signal pick-up since it does not require inductors and will be physically much smaller than an LC delay line.

One knowledgeable in the art will realize that other means may be devised for summing the current $i_2$ to the current $i_4$. The arrangement shown in FIGS. 2 and 3 is only one possible embodiment illustrating the principle.

This disclosure, therefore, provides for a new and improved delay circuit having a switchable delay. The switched delay circuit is suitable for use in multistandard color TV receivers. It is suitable for implementation in a single integrated circuit and is less sensitive to parasitic signal pick-up than the LC delay circuits currently used in color TV receivers.

I claim:

1. A switched delay circuit comprising: an input node; an output node; a first voltage bus; a second voltage bus; a first transistor having a base coupled to the input node, an emitter, and a collector coupled to the first voltage bus; a first resistor having a second end and a first end with the first end coupled to the emitter of the first transistor; a second transistor having a base, an emitter, and a collector coupled to the first voltage bus; a second resistor coupled between the second end of the first resistor and the base of the second transistor; a first capacitor coupled between the second end of the first resistor and the emitter of the second transistor; a first current source coupled between the emitter of the second transistor and the second voltage bus; a third transistor having a base, a collector, and an emitter coupled to the second voltage bus; a second capacitor coupled between the base of the second transistor and the base of the third transistor; a fourth transistor having a base, an emitter and a collector coupled to the output node; a third resistor coupled between the emitter of the first transistor and the emitter of the fourth transistor; a fourth resistor coupled between the collector of the third transistor and the emitter of the fourth transistor; a fifth resistor coupled between the base and collector of the third transistor; a sixth resistor coupled between the collector of the fourth transistor and the first voltage bus; and a bias voltage node coupled to the base of the fourth transistor.

2. The delay circuit of claim 1 further comprising: a control signal input node; and a fifth transistor having a base coupled to the control signal input node, a collector coupled to the first voltage bus, and an emitter coupled to the base of the second transistor such that the delay circuit provides a delay which may be enabled and disabled by the control signal.

3. A delay circuit having all-pass frequency response and comprising: an input, an output, a low-pass filter, and a subtracting circuit; the low-pass filter having an input coupled to the input of the delay circuit, a differentiated output, and a reactive element; the subtracting circuit having a first input coupled to the low-pass filter input, a second input coupled to the low-pass filter differentiated output, and an output coupled to the output of the delay circuit; the subtracting circuit providing an output signal proportional to the difference in magnitude of the first and second input signals of the subtracting circuit such that the delay circuit output signal is delayed in phase from the delay circuit input signal; a control input for enabling and disabling the phase delay between the delay circuit input and the delay circuit output and wherein the delay circuit is completely implemented in an integrated circuit; and wherein the subtracting circuit includes: a first transistor having a base coupled to the first input of the subtracting circuit, an emitter and a collector; a second transistor having a collector coupled to the output of the subtracting circuit, a base, and an emitter; a first resistor coupled between the first input of the subtracting circuit and the collector of the first transistor; a second resistor coupled between the collector of the first transistor and the emitter of the second transistor; a third resistor coupled between the second input of the subtracting circuit and the emitter of the second transistor; a first voltage bus; a fourth resistor coupled between the collector of the second transistor and the first voltage bus; a second voltage bus coupled to the emitter of the first transistor; and a bias voltage node coupled to the base of the second transistor.

4. The delay circuit of claim 3 further including a plurality of such delay circuits connected in a series combination to provide a high-order all-pass transfer function.

* * * * *